(12) United States Patent
Ohashi et al.

(10) Patent No.: US 11,432,449 B2
(45) Date of Patent: Aug. 30, 2022

(54) BOARD WORKING SYSTEM

(71) Applicant: FUJI CORPORATION, Chiryu (JP)

(72) Inventors: Teruyuki Ohashi, Anjyo (JP); Toshiya Suzuki, Ichinomiya (JP)

(73) Assignee: FUJI CORPORATION, Chiryu (JP)

( * ) Notice: Subject to any disclaimer, the term of this patent is extended or adjusted under 35 U.S.C. 154(b) by 43 days.

(21) Appl. No.: 16/019,068

(22) Filed: Jun. 26, 2018

(65) Prior Publication Data

US 2018/0332748 A1 Nov. 15, 2018

Related U.S. Application Data

(63) Continuation of application No. 14/648,495, filed as application No. PCT/JP2012/081110 on Nov. 30, 2012, now Pat. No. 10,051,770.

(51) Int. Cl.
*H05K 13/04* (2006.01)
*H05K 13/08* (2006.01)
(Continued)

(52) U.S. Cl.
CPC ..... *H05K 13/0495* (2013.01); *H05K 13/0061* (2013.01); *H05K 13/084* (2018.08);
(Continued)

(58) Field of Classification Search
CPC .......... H05K 13/0015; H05K 13/0061; H05K 13/0495; H05K 13/08; H05K 13/081;
(Continued)

(56) References Cited

U.S. PATENT DOCUMENTS 4,850,104 A 7/1989 Matrone et al.
6,892,446 B2 * 5/2005 Hwang .............. H05K 13/0061
29/740

(Continued)

FOREIGN PATENT DOCUMENTS

JP 2005 019563 1/2005
JP 2007 123503 5/2007
(Continued)

OTHER PUBLICATIONS

S. Hwang and D. G. M. Mostafa, "Flexible inspection system for a PC board assembly line," ISIE '93—Budapest: IEEE International Symposium on Industrial Electronics Conference Proceedings, 1993, pp. 425-428, doi: 10.1109/ISIE.1993.268768. (Year: 1993).*

(Continued)

*Primary Examiner* — A. Dexter Tugbang
(74) *Attorney, Agent, or Firm* — Oblon, McClelland, Maier & Neustadt, L.L.P.

(57) ABSTRACT

A system including multiple inspection machines and an NG board discharge machine which moves an NG board to a checking position visible to a worker. The system acquires positional information of a circuit board during conveyance, and stores the NG board by associating a work result for the NG board with the positional information. In this manner, the positional information of the NG board is acquired. Based on the positional information, it is determined whether or not the circuit board conveyed to the NG board discharge machine is the NG board. When the circuit board conveyed to the NG board discharge machine is the NG board, a checking-purpose working machine discharges the NG board to the checking position.

4 Claims, 14 Drawing Sheets

(51) Int. Cl.
*H05K 13/00* (2006.01)
*H05K 3/00* (2006.01)

(52) U.S. Cl.
CPC ....... *H05K 3/0008* (2013.01); *H05K 13/0015* (2013.01); *H05K 13/046* (2013.01); *H05K 13/08* (2013.01); *H05K 13/081* (2018.08); *H05K 13/085* (2018.08); *H05K 13/0812* (2018.08); *Y10T 29/49004* (2015.01); *Y10T 29/49131* (2015.01); *Y10T 29/532* (2015.01); *Y10T 29/53174* (2015.01); *Y10T 29/53178* (2015.01); *Y10T 29/53187* (2015.01)

(58) Field of Classification Search
CPC .. H05K 13/084; H05K 13/085; H05K 13/046; H05K 3/0008; H05K 13/0812; Y10T 29/49004; Y10T 29/49131; Y10T 29/53174; Y10T 29/53178; Y10T 29/53187; Y10T 29/532
See application file for complete search history.

(56) References Cited

U.S. PATENT DOCUMENTS

| | | | |
|---|---|---|---|
| 2005/0108872 A1* | 5/2005 | Konrath | H05K 13/0061 29/831 |
| 2009/0043414 A1* | 2/2009 | Maenishi | H05K 13/085 700/101 |
| 2011/0007146 A1* | 1/2011 | Kaida | H05K 13/0812 348/87 |
| 2011/0232082 A1* | 9/2011 | Kim | H05K 13/046 29/740 |

FOREIGN PATENT DOCUMENTS

| | | | |
|---|---|---|---|
| JP | 2007184309 A | * | 7/2007 |
| JP | 2008 135581 | | 6/2008 |
| JP | 2011 138930 | | 7/2011 |

OTHER PUBLICATIONS

International Search Report dated Jan. 29, 2013 in PCT/JP12/081110 Filed Nov. 30, 2012.
Extended European Search Report dated Feb. 17, 2016 in Patent Application No. 12889344.3.

* cited by examiner

FIG. 3
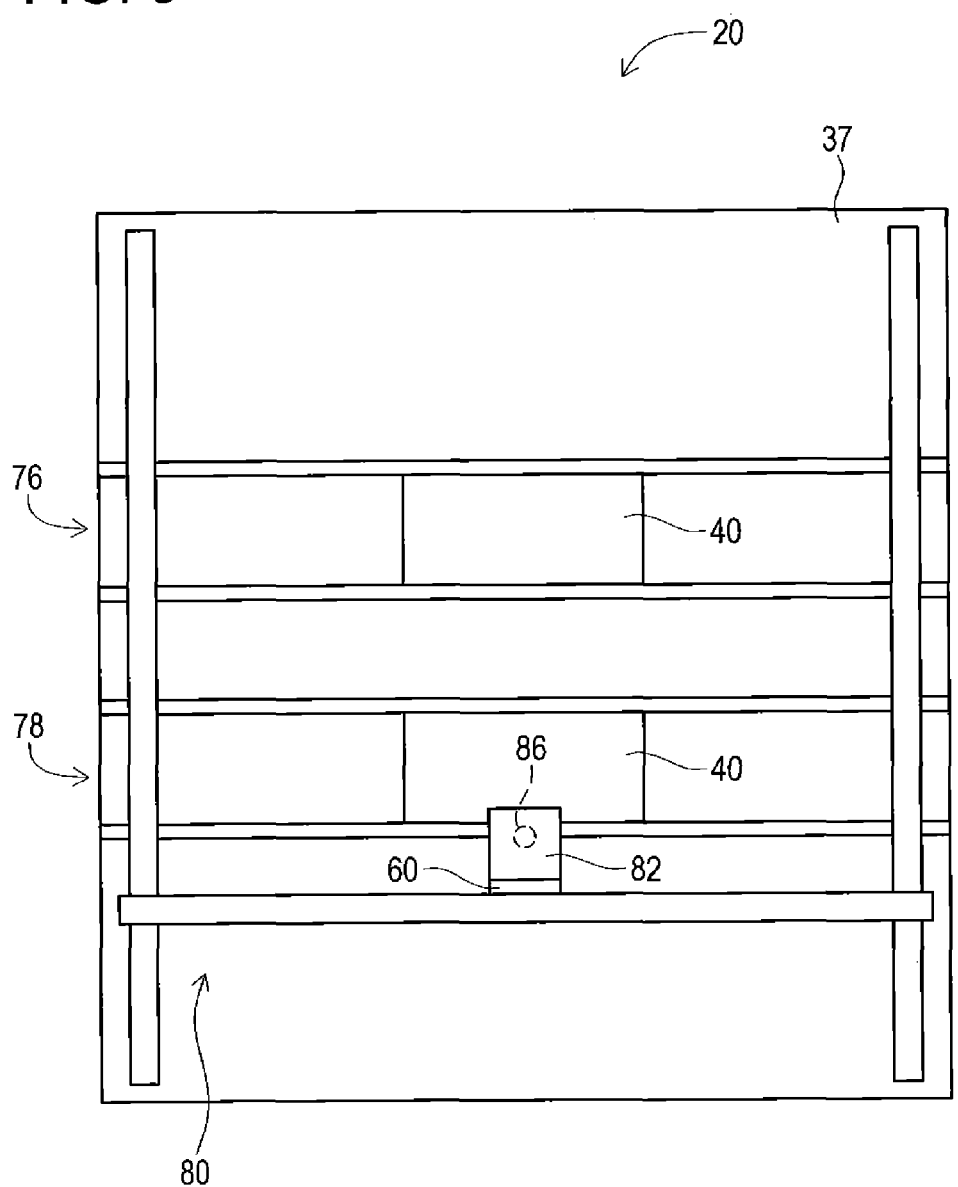
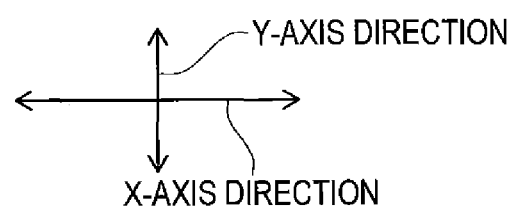

BOARD WORKING SYSTEM

CROSS-REFERENCE TO RELATED APPLICATIONS

The present application is a continuation of U.S. application Ser. No. 14/648,495, filed May 29, 2015, which is a National Stage of PCT/JP2012/081110, filed Nov. 30, 2012, the entire contents of each of which are incorporated herein by reference.

TECHNICAL FIELD

The present application relates to a board working system in which circuit boards arranged on an upstream side to a downstream side of multiple working machines are conveyed through multiple paths.

BACKGROUND ART

A board working system generally includes multiple working machines arrayed therein. Then, circuit boards are conveyed from an upstream side to a downstream side of the multiple working machines. The multiple working machines include a working machine which carries out printing work of solder cream on the circuit boards, and a working machine which carries out mounting work of electronic components on the circuit boards. The multiple working machines also include an inspection machine for inspecting work results in various types of work. The inspection work by an inspection machine is automatically carried out. Accordingly, inspection standards have become very strict, and thus circuit boards having a minor defect are discarded in some cases.

In view of the above-described circumstances, in aboard working system disclosed in PTL 1, imaging data of a circuit board whose inspection result is determined as unsatisfactory by an inspection machine (hereinafter, sometimes referred to as an "NG board") is transmitted to a display device independent from a conveyance line, and an image of the NG board is displayed on the display device. Then, a worker checks the image of the NG board, thereby preventing the circuit board having a minor defect from being discarded. In addition, a board working system disclosed in PTL 2 includes a checking-purpose working machine which moves the NG board to a checking position which is visible to a worker. The checking-purpose working machine is arranged adjacent of a downstream side of the inspection machine. Then, the worker checks the NG board moved to the checking position, thereby preventing the circuit board having a minor defect from being discarded.

PTL 1: JP-A-2008-135581
PTL 2: JP-A-2007-123503

BRIEF SUMMARY

Technical Problem

According to the board working systems disclosed in PTL 1 and PTL 2, it is possible to prevent a circuit board having a minor defect from being discarded. However, in a case of the board working system disclosed in PTL 1, if the checking work of the worker is delayed, the circuit board waiting for the checking work stays inside the inspection machine, thereby causing a problem of decreased throughput.

On the other hand, in a case of the board working system disclosed in PTL 2, the NG board is discharged to the checking position. Accordingly, it is possible to prevent the circuit board from staying inside the inspection machine. However, when a conveyance path of the circuit board is disposed at multiple locations, in order to identify the conveyance path of the NG board, it is necessary to arrange the checking-purpose working machine adjacent of the downstream side of the inspection machine. The reason is that since the circuit board inspected by the inspection machine is conveyed to the checking-purpose working machine without passing through the other working machine, the conveyance path of the NG board conveyed to the checking-purpose working machine can be easily identified. However, when the multiple inspection machines are arranged in the system, multiple checking-purpose working machines are required, thereby causing a problem of a large-sized system.

However, if it is possible to easily identify the conveyance path of the NG board, to be more exact, a position where the NG board is conveyed, it is not necessary to arrange the checking-purpose working machine adjacent of the downstream side of the inspection machine. Therefore, even when the multiple inspection machines are arranged in the system, one checking-purpose working machine can correspond to the multiple inspection machines. As described above, there is room for improvement when the checking work of the NG board is carried out in the board working system having multiple conveyance paths. Therefore, if there is any improvement, higher practicality of the board working system can be achieved. The present disclosure is made in view of the above-described circumstances, and an object thereof is to provide a highly practical board working system.

Solution to Problem

In order to solve the above-described problem, according to an aspect of the present disclosure, a board working system carries out work for circuit boards in such a way that multiple working machines are arrayed therein, the circuit boards arranged on an upstream side to a downstream side of the multiple working machines are conveyed through multiple paths, and each of the multiple working machines sequentially carries out work for the circuit boards. The multiple working machines include at least one inspection-purpose working machine which inspects the work for the circuit boards, and a checking-purpose working machine which has a board moving mechanism for moving the circuit boards to a checking position visible to a worker and which is arranged on a downstream side of the at least one of the inspection-purpose working machines. The board working system includes a control device including a positional information acquisition unit that acquires positional information of each of the multiple conveyed circuit boards, a memory section that stores a defective board which is the circuit board whose work result is determined as unsatisfactory by the at least one of the inspection-purpose working machines by associating the work result with the positional information acquired by the positional information acquisition unit, a determination unit that determines whether or not the circuit board conveyed to the checking-purpose working machine is the defective board, based on the work result and the positional information which are stored in the memory section, and a moving mechanism operation control unit that controls an operation of the board moving mechanism and moves the defective board to the checking position, when the determination unit determines that the circuit board conveyed to the checking-purpose working machine is the defective board.

In addition, according to the board working system of the present disclosure, the control device has a display unit that causes a display device disposed in the board working system to display the work result for the defective board stored in the memory section, when the determination unit determines that the circuit board conveyed to the checking-purpose working machine is the defective board.

In addition, according to the board working system of the present disclosure, the at least one of the inspection-purpose working machines represents multiple inspection-purpose working machines.

In addition, according to the board working system of the present disclosure, with respect to the multiple circuit boards conveyed through each of the multiple paths, the positional information acquisition unit stores a sequence and a conveying path of the circuit boards conveyed through each path, and acquires the positional information, based on the sequence and the path of the circuit boards.

In addition, according to the board working system of the present disclosure, with respect to the multiple circuit boards conveyed through each of the multiple paths, the positional information acquisition unit sets a symbol for distinguishing the circuit boards from each other, and acquires the positional information, based on the symbol, the path through which the circuit board having the set signal is conveyed, and the working machine which conveys the circuit board having the set signal.

In addition, according to the present disclosure, aboard working system carries out work for circuit boards in such a way that multiple working machines are arrayed therein, the circuit boards arranged on an upstream side to a downstream side of the multiple working machines are conveyed through multiple paths, and each of the multiple working machines sequentially carries out work for the circuit boards. In the board working system, the multiple working machines include multiple inspection-purpose working machines which inspect the work for the circuit boards, and a checking-purpose working machine which has a board moving mechanism for moving the circuit boards to a checking position visible to a worker and which is arranged on a downstream side of the multiple inspection-purpose working machines.

Advantageous Effects

In the board working system according to the present disclosure, the multiple working machines configuring the system include at least one of the inspection machines and the checking-purpose working machine which moves an NG board to a checking position visible to a worker. The system acquires the positional information of the circuit boards during conveyance, and stores the NG board by associating a work result thereof with the positional information. That is, the positional information of the NG board is acquired. In this manner, the system determines whether or not the circuit board conveyed to the checking-purpose working machine is the NG board. Then, when the system determines that the circuit board conveyed to the checking-purpose working machine is the NG board, the NG board is discharged to the checking position in the checking-purpose working machine. As described above, the NG board is discharged to the checking position, based on the positional information of the NG board. Therefore, it is not necessary to arrange the checking-purpose working machine adjacent of the downstream side of the inspection machines, and it is possible to arrange another working machine between the checking-purpose working machine and the inspection machine. In this manner, it is possible to reduce constraints in an arrangement order of the working machines. In addition, even when the multiple inspection machines are arranged in the system, one checking-purpose working machine can correspond to the multiple inspection machines. In this manner, it is possible to prevent the system from increasing in size.

In addition, when the NG board is conveyed to the checking-purpose working machine, the work result may be stored by being associated with the positional information of the NG board is displayed on the display device. In this manner, a worker can efficiently carry out the checking work of the NG board while watching the work result.

In addition, the multiple inspection machines may be arranged. In this manner, an effect of acquiring the positional information of the NG board is utilized sufficiently.

In addition, the positional information of the circuit boards may be acquired, based on the path through which the circuit boards are conveyed and based on the sequence of the circuit boards conveyed through the path. In this manner, it is possible to reliably acquire the positional information of the circuit boards.

In addition, the symbol for distinguishing the circuit boards from each other may be set for the multiple circuit boards. Then, the positional information of the circuit boards is acquired, based on the symbol, the conveyance path of the circuit boards having the set signal, and the working machine where the circuit boards having the set signal are located. In this manner, it is possible to reliably acquire the positional information of the circuit boards.

In addition, the multiple working machines configuring the system may include the multiple inspection machines and the checking-purpose working machine which moves the NG board to the checking position visible to a worker. In this manner, it is possible to achieve a compact system.

BRIEF DESCRIPTION OF DRAWINGS

FIG. 3 is a view illustrating an inspection machine included in the electronic component mounting system.

DETAILED DESCRIPTION

Hereinafter, as forms for embodying the present disclosure, embodiments of the present disclosure will be described in detail with reference to the drawings.

<Configuration of Electronic Component Mounting System>

Figure 1:
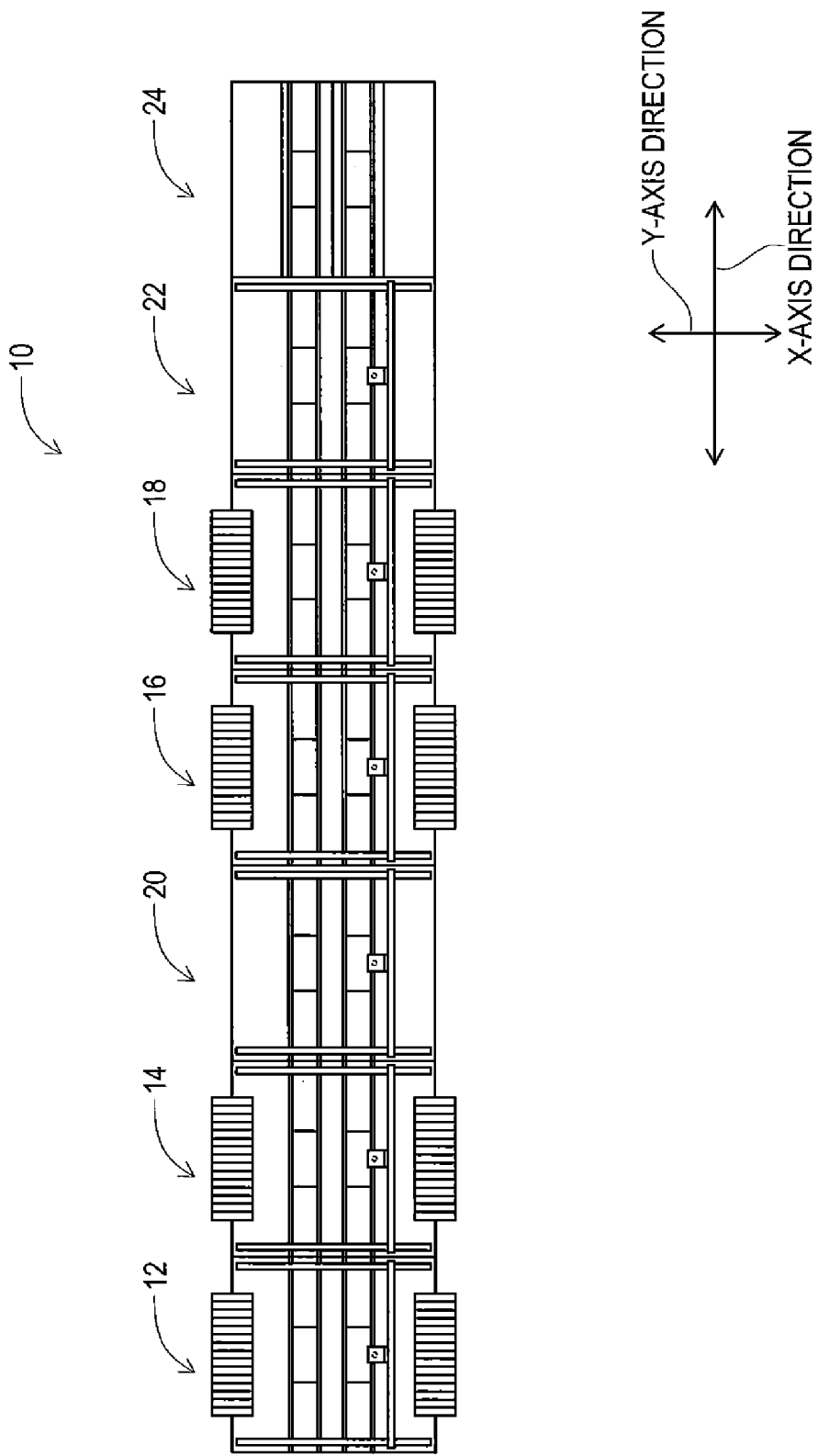
FIG. 1 is a view illustrating an electronic component mounting system according to an embodiment of the present disclosure.

FIG. 1 illustrates an electronic component mounting system (hereinafter, sometimes abbreviated as a "mounting system") 10 according to an embodiment of the present disclosure. The mounting system 10 is a system for mounting an electronic circuit component (hereinafter, sometimes abbreviated as an "electronic component") on a circuit board. The mounting system 10 is configured by seven working machines including four electronic component mounting machines (hereinafter, sometimes abbreviated as "mounting machines") 12, 14, 16, and 18, two inspection machines 20 and 22, and one NG board discharge machine 24.

The seven working machines are arrayed from the upstream side in the order of the mounting machine 12, the mounting machine 14, the inspection machine 20, the mounting machine 16, the mounting machine 18, the inspection machine 22, and the NG board discharge machine 24. In the following description, a direction in which the seven working machines are arrayed side by side is referred to as an X-axis direction, and a horizontal direction perpendicular to the direction is referred to as a Y-axis direction.

Figure 2:
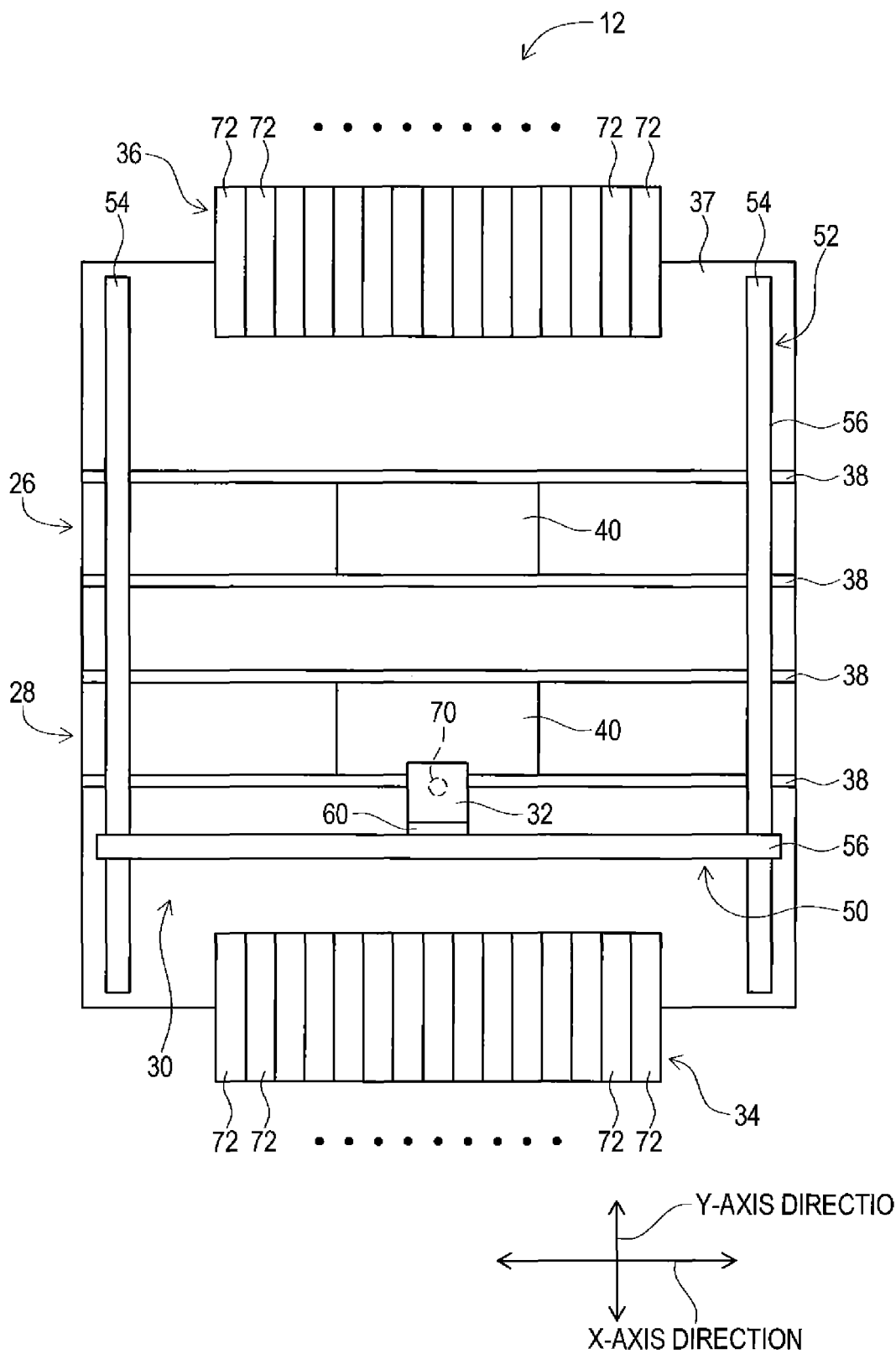
FIG. 2 is a view illustrating an electronic component mounting machine included in the electronic component mounting system.

First, the mounting machines 12, 14, 16, and 18 will be described. The four mounting machines 12, 14, 16, and 18 have configurations substantially the same as one another. Accordingly, the mounting machine 12 will be described as a representative. As illustrated in FIG. 2, the mounting machine 12 includes a pair of conveyance devices 26 and 28, a mounting head moving device (hereinafter, sometimes abbreviated as a "moving device") 30, a mounting head 32, and a pair of supply devices 34 and 36.

The pair of conveyance devices 26 and 28 are arranged on a base 37 so as to be parallel to each other and to extend in the X-axis direction. The pair of conveyance devices 26 and 28 have configurations the same as each other, and are arranged to be symmetrical to each other in the Y-axis direction. Each of the pair of conveyance devices 26 and 28 has a pair of conveyor belts 38 extending in the X-axis direction and an electromagnetic motor (not illustrated) for turning the conveyor belts 38. A circuit board 40 is supported by the pair of conveyor belts 38, and is conveyed in the X-axis direction by the drive of the electromagnetic motor. In addition, each of the pair of conveyance devices 26 and 28 has a board holding device (not illustrated). The board holding device fixedly holds the circuit board 40 supported by the conveyor belts 38 at a predetermined position (position where the circuit board 40 is illustrated in FIG. 2). When the conveyance devices 26 and 28 are distinguished from each other, in some cases, one conveyance device between the pair of conveyance devices 26 and 28 (conveyance device located above in FIG. 2) is referred to as a first conveyance device 26, and the other conveyance device (conveyance device located below in FIG. 2) is referred to as a second conveyance device 28.

In addition, the moving device 30 is configured to include an X-axis-direction slide mechanism 50 and a Y-axis-direction slide mechanism 52. The Y-axis-direction slide mechanism 52 has a pair of Y-axis-direction guide rails 54 extending in the Y-axis direction. On the other hand, the X-axis-direction slide mechanism 50 has an X-axis-direction guide rail 56 extending in the X-axis direction. The X-axis-direction guide rail 56 is laid across the pair of Y-axis-direction guide rails 54. The Y-axis-direction slide mechanism 52 has an electromagnetic motor (not illustrated), and the X-axis-direction guide rail 56 is moved to any desired position in the Y-axis direction by the drive of the electromagnetic motor. The X-axis-direction guide rail 56 holds a slider 60 so as to be movable along its own axis. The X-axis-direction slide mechanism 50 has an electromagnetic motor (not illustrated), and the slider 60 is moved to any desired position in the X-axis direction by the drive of the electromagnetic motor. The mounting head 32 is attached to the slider 60. According to this structure, the mounting head 32 is moved to any desired position on the base 37 by the moving device 30. The mounting head 32 is attachable to and detachable from the slider 60 with a single touch. As will be described later, this enables a user to change different types of working heads, for example, an inspection head or the like.

In addition, the mounting head 32 has a suction nozzle 70 disposed on a lower end surface. The suction nozzle 70 is connected to a positive-negative pressure supply device (not illustrated). In this manner, the suction nozzle 70 sucks and holds an electronic component by using negative pressure, and causes the electronic component to be separated therefrom by using positive pressure. Furthermore, the mounting head 32 has a nozzle raising and lowering device (not illustrated) which raises and lowers the suction nozzle 70 and a nozzle rotating device (not illustrated) which rotates the suction nozzle 70 around the axis. In this manner, a vertical position and a held posture of the electronic component held by the suction nozzle 70 are adjusted.

In addition, the pair of supply devices 34 and 36 are arranged in both end portions in the Y-axis direction of the base 37 so as to interpose the pair of conveyance devices 26 and 28 therebetween. The respective supply devices 34 and 36 have a tape feeder 72. The tape feeder 72 accommodates a taped component in a state where the taped component is wound therearound. The taped component is configured so that an electronic component is taped thereon. Then, the tape feeder 72 feeds the taped component by using a feeding device (not illustrated). In this manner, the respective supply devices 34 and 36 feed the taped component, thereby supplying the electronic component to a supply position. The tape feeder 72 is attachable to and detachable from the base 37.

Next, the inspection machines 20 and 22 will be described. The inspection machine 20 will be described as a representative, since the two inspection machines 20 and 22 have configurations substantially the same as each other. As illustrated in FIG. 3, the inspection machine 20 includes a pair of conveyance devices 76 and 78, an inspection head moving device (hereinafter, sometimes abbreviated as a "moving device") 80, and an inspection head 82.

The pair of conveyance devices 76 and 78 have structures the same as that of the conveyance devices 26 and 28 of the mounting machine 12. When the conveyance device 76 and the conveyance device 78 are distinguished from each other, in some cases, one conveyance device connected to the first conveyance device 26 of the mounting machine 14 between the pair of conveyance devices 76 and 78 (conveyance device located above in FIG. 3) is referred to as a first conveyance device 76, and the other conveyance device connected to the second conveyance device 28 of the mounting machine 14 (conveyance device located below in FIG. 3) is referred to as a second conveyance device 78.

The moving device 80 has a structure the same as that of the moving device 30 of the mounting machine 12. The inspection head 82 is mounted on the slider 60 of the moving device 80. The inspection head 82 has an inspection camera 86 disposed on a lower end surface. The inspection camera 86 captures an image so as to inspect whether or not mounting work of an electronic component on the circuit board 40 is satisfactorily carried out.

Figure 4:
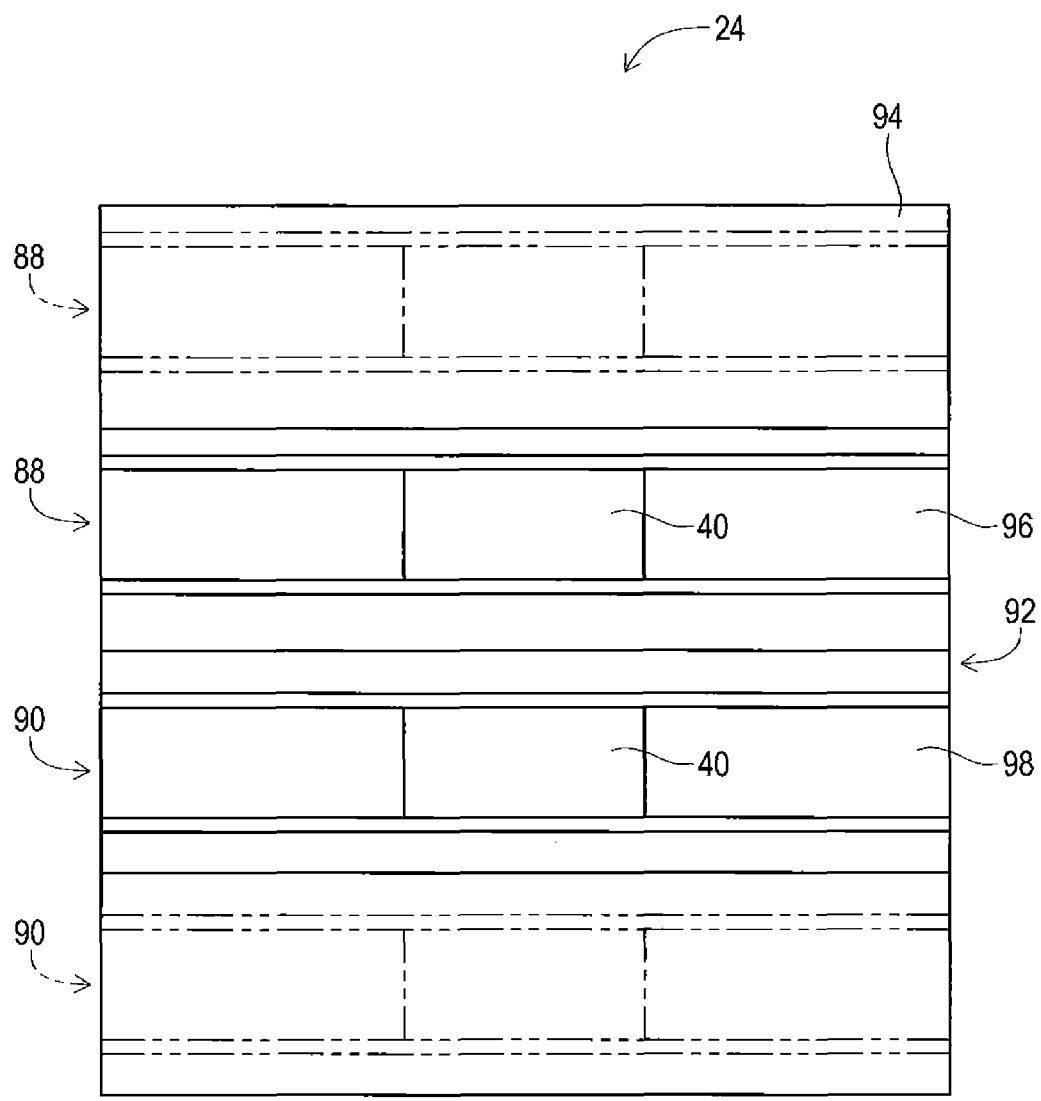
FIG. 4 is a view illustrating an NG board discharge machine included in the electronic component mounting system.

In addition, as illustrated in FIG. 4, the NG board discharge machine 24 arranged on the most downstream side includes conveyance devices 88 and 90 having structures the same as that of the conveyance devices 26 and 28 of the mounting machine 12. The conveyance devices 88 and 90 are arranged on abase 94 via a discharge mechanism 92. The discharge mechanism 92 has two panels 96 and 98 having substantially rectangular shapes. The respective panels 96 and 98 are arranged on the base 94 so that a longitudinal direction thereof extends in the X-axis direction. The pair of conveyance devices 88 and 90 are arranged on an upper surface of the two panels 96 and 98. When the conveyance device 88 and the conveyance device 90 are distinguished from each other, in some cases, one conveyance device connected to the first conveyance device 76 of the inspection machine 22 between the pair of conveyance devices 88 and 90 (conveyance device located above in FIG. 4) is referred to as a first conveyance device 88, and the other conveyance device connected to the second conveyance device 78 of the inspection machine 22 (conveyance device located below in FIG. 4) is referred to as a second conveyance device 90.

The respective panels 96 and 98 are slidable on the base 94 in the Y-axis direction. The discharge mechanism 92 has an electromagnetic motor (refer to FIG. 7) 100 for causing the respective panels 96 and 98 to slide in the Y-axis direction. In this manner, the circuit board conveyed from the inspection machine 22 can be discharged from the conveyance line by moving the conveyance devices 88 and 90 in the Y-axis direction.

Figure 5:
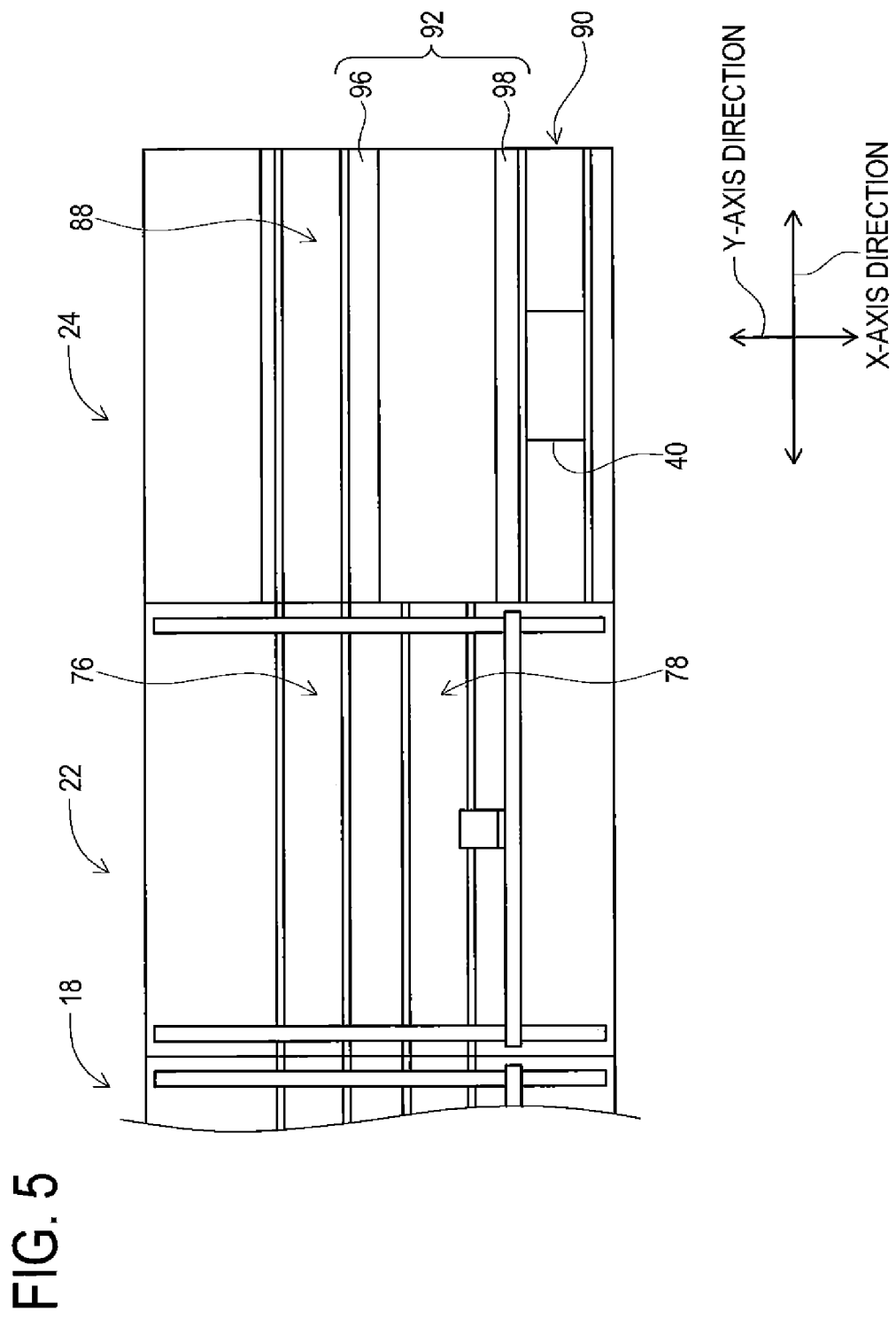
FIG. 5 is a view illustrating the NG board discharge machine in a state where a circuit board is discharged to a checking position.

Specifically, the second conveyance device 90 is usually connected to the second conveyance device 78 of the inspection machine 22. Therefore, the circuit board is conveyed from the first conveyance device 76 of the inspection machine 22 to the second conveyance device 90, and is held by the second conveyance device 90. Then, the second conveyance device 90 is moved in a direction separating from the first conveyance device 88, thereby moving the second conveyance device 90 to a position illustrated by a two-dot chain line in FIG. 4. In this manner, the circuit board 40 held by the second conveyance device 90 is discharged from the conveyance line as illustrated in FIG. 5. A position of the second conveyance device 90 which is illustrated in FIG. 5 serves as a checking position. A worker can visibly check the circuit board 40 discharged to the position. Then, the worker can remove the circuit board 40 from the checking position.

Figure 6:
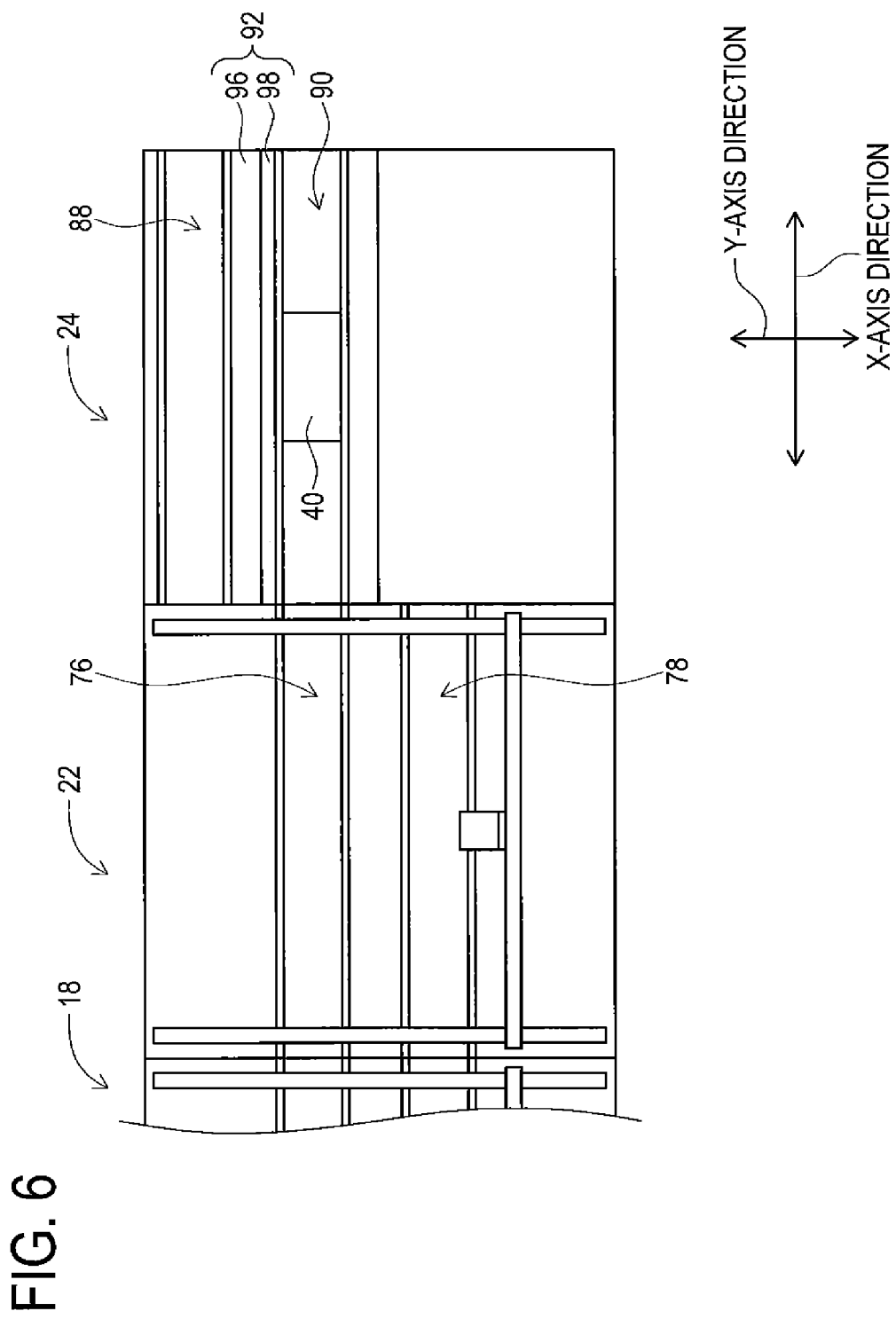
FIG. 6 is a view illustrating the NG board discharge machine in a state where a conveyance device is moved by an operation of a discharge mechanism.

On the other hand, the first conveyance device 88 is moved in a direction separating from the second conveyance device 90, thereby moving the first conveyance device 88 to a position illustrated by a two-dot chain line in FIG. 4. Then, when the first conveyance device 88 is moved to the position illustrated by the two-dot chain line in the drawing, the second conveyance device 90 is moved in a direction closer to the first conveyance device 88, thereby moving the second conveyance device 90 to a position where the first conveyance device 88 is illustrated by a solid line in FIG. 4. In this manner, as illustrated in FIG. 6, the second conveyance device 90 is connected to the first conveyance device 76 of the inspection machine 22. Therefore, the circuit board can be moved from the first conveyance device 76 of the inspection machine 22 to the second conveyance device 90. Then, the second conveyance device 90 is moved to the checking position, thereby enabling the worker to visibly check the circuit board and to remove the circuit board 40 from the checking position.

In addition, the NG board discharge machine 24 has a display device (refer to FIG. 7) 102. The display device 102 displays an inspection result of the circuit board discharged in the NG board discharge machine 24.

Figure 7:
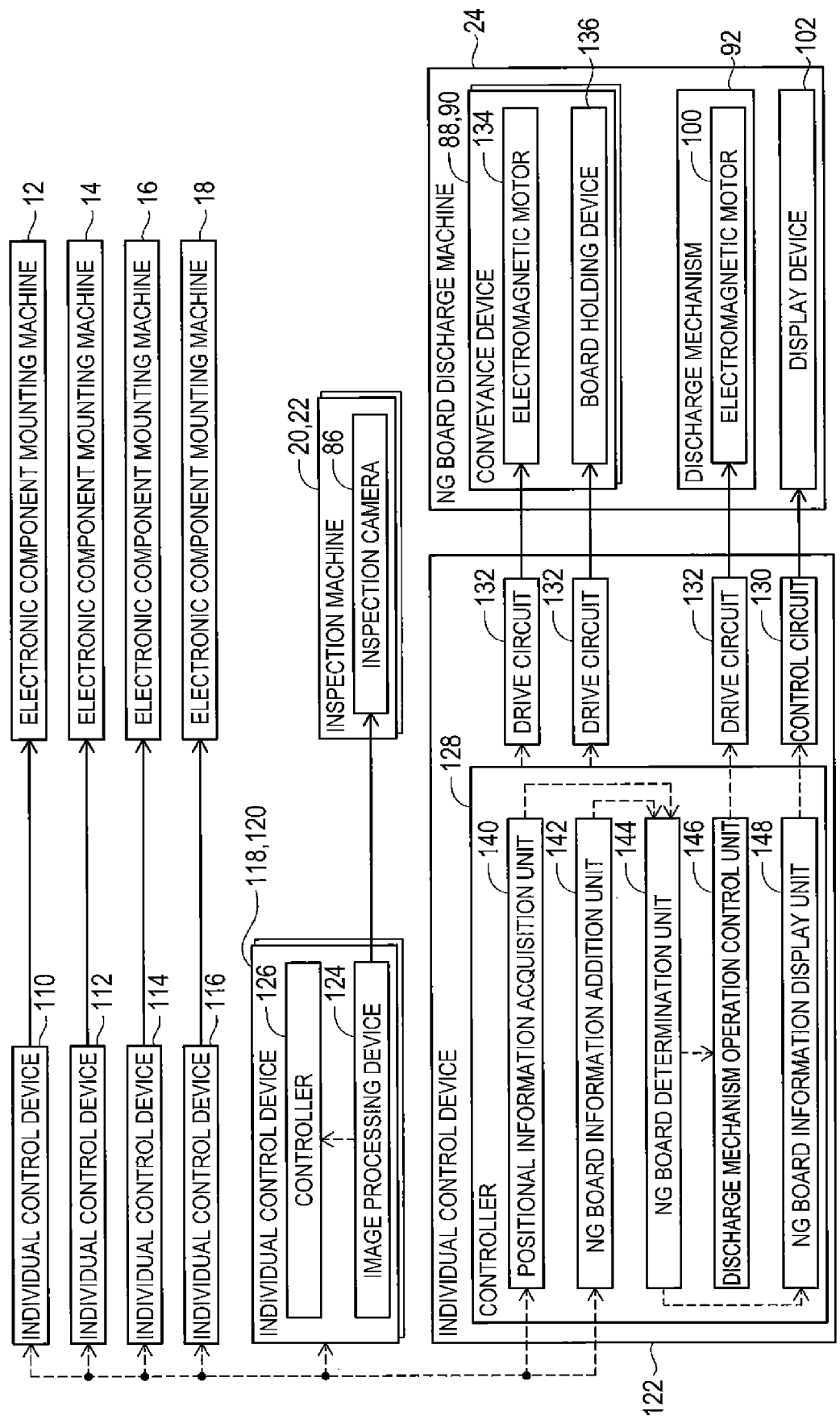
FIG. 7 is a block diagram illustrating an individual control device provided for each of multiple working machines configuring the electronic component mounting system.

In addition, as illustrated in FIG. 7, the mounting system 10 includes multiple individual control devices 110, 112, 114, 116, 118, 120, and 122 disposed corresponding to the mounting machines 12, 14, 16, and 18, the inspection machines and 22, and the NG board discharge machine 24. The individual control devices 118 and 120 disposed corresponding to the inspection machines 20 and 22 include an image processing device 124 and a controller 126. The image processing device 124 is connected to the inspection camera 86, and processes image data obtained by the inspection camera 86. The controller 126 includes a CPU, a ROM, a RAM, or the like, is based on a computer, and is connected to the image processing device 124. In this manner, the controller 126 determines whether or not the mounting work of the electronic component on the circuit board is satisfactorily carried out.

In addition, the individual control device 122 disposed corresponding to the NG board discharge machine 24 includes a controller 128, a control circuit 130, and multiple drive circuits 132. The control circuit 130 is connected to the display device 102, and the multiple drive circuits 132 are connected to an electromagnetic motor 134 and a board conveyance device 136 of the conveyance devices 88 and 90, and the electromagnetic motor 100 of the discharge mechanism 92. The controller 128 includes a CPU, a ROM, a RAM, or the like, is based on a computer, and is connected to the control circuit 130 and the multiple drive circuits 132. In this manner, the controller 128 controls the operation of the conveyance devices 88 and 90 and the discharge mechanism 92, and the display on the display device 102. The individual control devices 110, 112, 114, and 116 disposed corresponding to the mounting machines 12, 14, 16, and 18 also include a controller, but have a configuration similar to that of the above-described controllers. Accordingly, detailed descriptions and illustrations will be omitted. In addition, the controllers 126 and 128 of the multiple individual control devices 110, 112, 114, 116, 118, 120, and 122 are connected to each other. Information, a command, or the like is transmitted and received between the controllers 126 and 128.

<Control of Mounting System>

According to the above-described configuration, in the mounting system 10, the circuit board 40 is conveyed from the mounting machine 12 arranged on the most upstream side to the NG board discharge machine 24 arranged on the most downstream side. Each of the mounting machines 12, 14, 16, and 18 sequentially carries out work for the conveyed circuit board 40. The inspection machines 20 and 22 inspect whether or not the work is satisfactorily carried out by each working machine. The circuit board 40 whose inspection result is not satisfactory is discharged by the NG board discharge machine 24.

Specifically, in the mounting machine 12, according to a command from the individual control device 110, the first conveyance device 26 or the second conveyance device 28 first conveys the circuit board 40 to a working position, and fixedly holds the circuit board 40 at the position. Then, according to a command from the individual control device 110, the mounting head 32 moves onto a supply position of the supply devices 34 and 36, and sucks and holds the electronic component from the supply devices 34 and 36. Subsequently, the mounting head 32 moves onto the circuit board 40, and mounts the electronic component on the circuit board 40. Then, the circuit board 40 on which mounting work is completed is conveyed toward the mounting machine 14 by the respective conveyance devices 26 and 28. Information indicating that the circuit board 40 is fixed at the working position, that is, information indicating that the work starts and information indicating that mounting work is completed are transmitted from the individual control device 110 to the individual control device 122 of the NG board discharge machine 24.

Thereafter, the mounting machine 14 carries out work the same as that of the above-described mounting machine 12, thereby completing the mounting work of the electronic component on the circuit board 40. Then, the circuit board 40 on which the mounting work is completed is conveyed toward the inspection machine 20 by the respective conveyance devices 26 and 28 of the mounting machine 14.

In the inspection machine 20, according to a command from the individual control device 118, the first conveyance device 76 or the second conveyance device 78 conveys the circuit board 40 to a working position, and fixedly holds the circuit board 40 at the position. Then, according to a command from the individual control device 118, the inspection head 82 moves onto the circuit board 40, and the inspection camera 86 images the circuit board 40. The image data obtained by the inspection camera 86 is processed in the image processing device 124, thereby acquiring information related to a mounting state of the electronic component on the circuit board 40. Based on this information, inspection work is carried out for the circuit board 40 on which the electronic component is mounted. Then, the circuit board 40 for which the inspection work is carried out is conveyed toward the mounting machine 16 by the respective conveyance devices 76 and 78. Information indicating that the work starts, information indicating that the inspection work is completed, and a result of the inspection work are transmitted from the individual control device 118 to the individual control device 122 of the NG board discharge machine 24.

Thereafter, the mounting machines 16 and 18 and the inspection machine 22 also carry out work the same as that of the above-described mounting machines 12 and 14 and the inspection machine 20, thereby completing the mounting work and the inspection work for the electronic component. Then, the circuit board 40 for which the mounting work and the inspection work are completed is conveyed toward the NG board discharge machine 24.

In the NG board discharge machine 24, discharge work of the circuit board 40 and display work of the inspection result are carried out based on various information items transmitted from the individual control devices 110, 112, 114, 116, 118, and 120 of the mounting machines 12, 14, 16, and 18 and the inspection machines 20 and 22.

Figure 8:
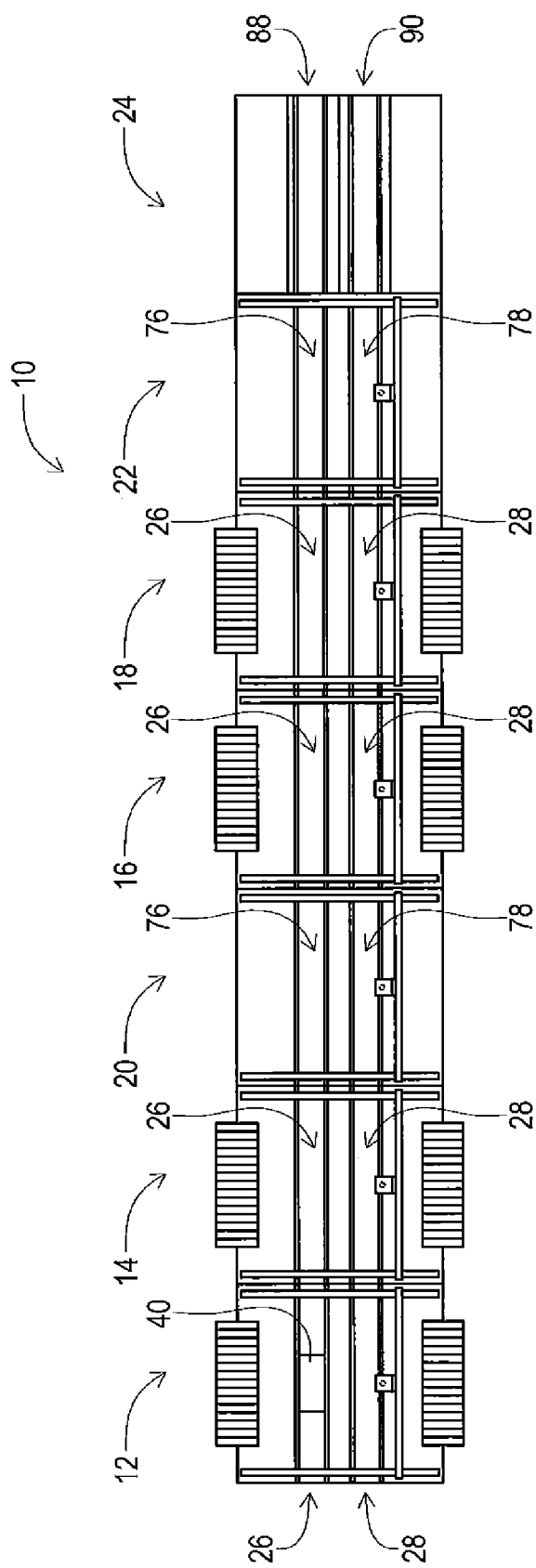
FIG. 8 is a view illustrating the electronic component mounting system and a positional information list in a state where the circuit board is conveyed.

Specifically, the controller 128 of the individual control device 122 of the NG board discharge machine 24 acquires positional information of the multiple circuit boards 40 conveyed inside the mounting system 10, based on work start information and work end information which are transmitted from each individual control device 110 and the like. To be more specific, for example, as illustrated in FIG. 8, when the circuit board 40 is held by the first conveyance device 26 of the mounting machine 12, the work start information is transmitted from the individual control device 110 of the mounting machine 12 to the individual control device 122 of the NG board discharge machine 24. Then, the controller 128 of the individual control device 122 sets the positional information on a positional information list, based on the transmission of the information.

The positional information list is map data controlled by the controller 128. As illustrated in FIG. 8, the positional information list is classified by a working lane and working machine number. The working lane is a lane through which the circuit board 40 is conveyed. The working lane is configured to include a first lane through which the circuit board 40 is conveyed by the first conveyance devices 26, 76, and 88 and a second lane through which the circuit board 40 is conveyed by the second conveyance devices 28, 78, and 90. In addition, the working machine number is the number allocated in the order of the seven working machines 12, 14, 16, 18, 20, 22, and 24 from the upstream side. The mounting machine 12 corresponds to the first working machine, the mounting machine 14 corresponds to the second working machine, the inspection machine 20 corresponds to the third working machine, the mounting machine 16 corresponds to the fourth working machine, the mounting machine 18 corresponds to the fifth working machine, the inspection machine 22 corresponds to the sixth working machine, and the NG board discharge machine 24 corresponds to the seventh working machine.

As is understood from the drawing, when the mounting work starts in the first conveyance device 26 of the mounting machine 12, a mark "O" is added to a column of the first working machine in the first lane on the positional information list, based on the work start information from the individual control device 110. This indicates that a new circuit board 40 is conveyed to the first conveyance device 26 of the mounting machine 12. The positional information list illustrated in the drawing is obtained by embodying the map data. In the controller 128 used in practice, the map data stores that the circuit board is located in the first working machine in the first lane.

Figure 9:
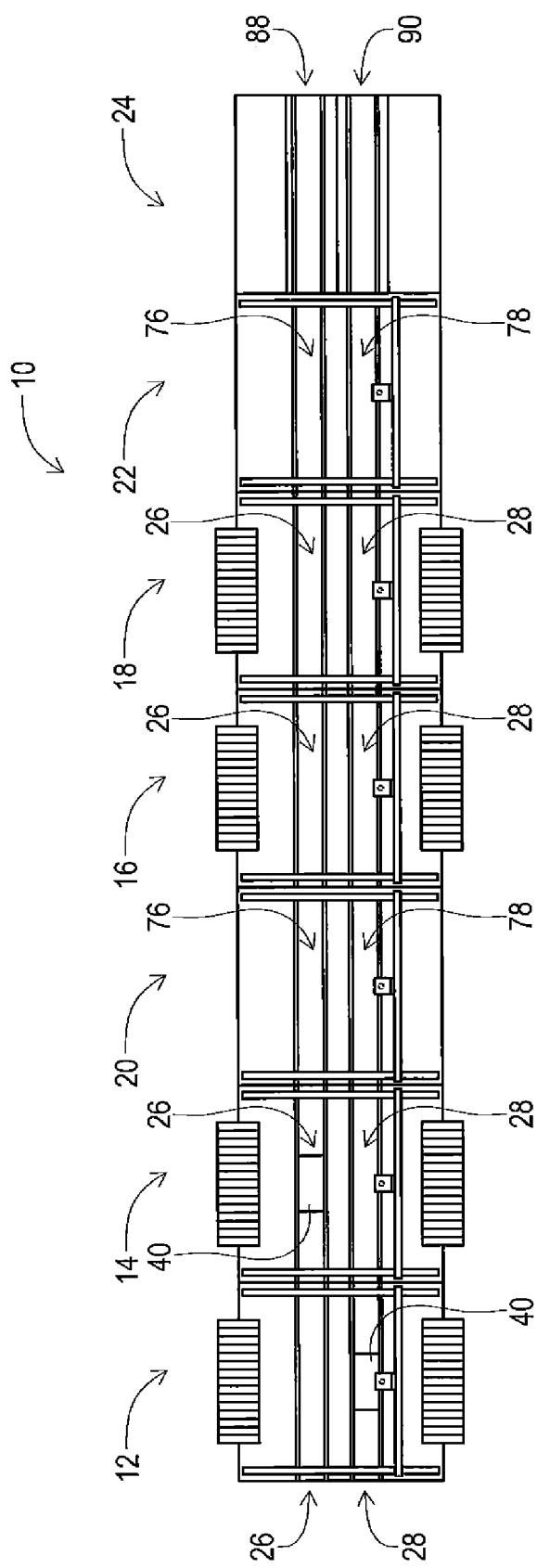
FIG. 9 is a view illustrating the electronic component mounting system and the positional information list in a state where the circuit board is conveyed.

Thereafter, if the mounting work is completed in the mounting machine 12, the circuit board 40 for which the mounting work is completed is conveyed into the mounting machine 14 as illustrated in FIG. 9, and is held by the first conveyance device 26 of the mounting machine 14. At this time, the work start information is transmitted from the individual control device 112 of the mounting machine 14 to the individual control device 122 of the NG board discharge machine 24. Then, based on the information, the mark "O" in the column of the first working machine in the first lane on the positional information list proceeds to a column of the second working machine in the first lane. This indicates that the circuit board 40 is moved from the first conveyance device 26 of the mounting machine 12 to the first conveyance device 26 of the mounting machine 14.

On the other hand, after the circuit board 40 for which the mounting work is completed is conveyed out, a new circuit board 40 is conveyed into the mounting machine 12 by the second conveyance device 28 as illustrated in FIG. 9. At this time, the work start information is transmitted from the individual control device 110 of the mounting machine 12 to the individual control device 122 of the NG board discharge machine 24. Then, based on the information, a mark "O" is added to a column of the first working machine in the second lane on the positional information list. This indicates that a new circuit board 40 is conveyed into the second conveyance device 28 of the mounting machine 12.

Figure 10:
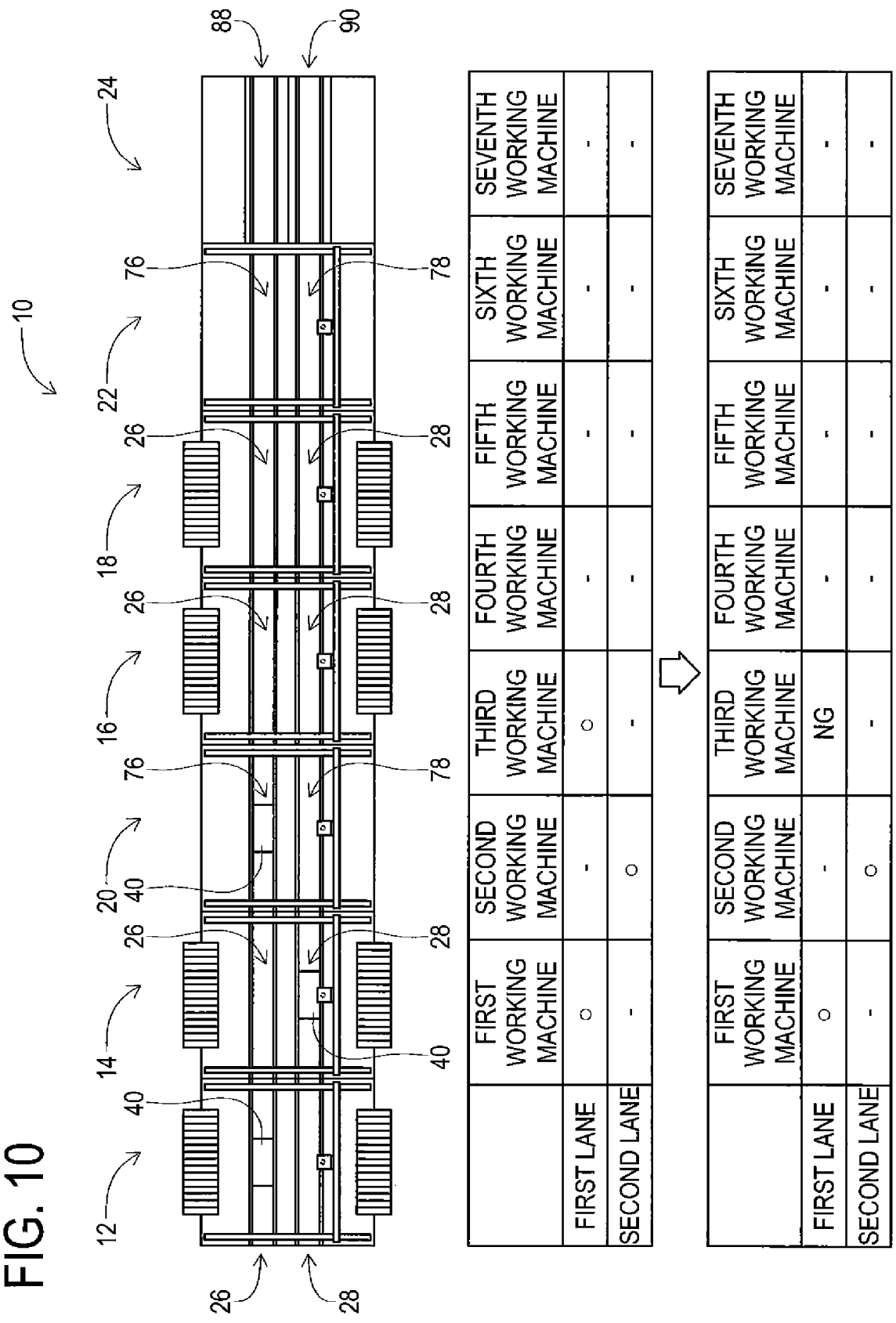
FIG. 10 is a view illustrating the electronic component mounting system and the positional information list in a state where the circuit board is conveyed.

Thereafter, if the mounting work is completed in the mounting machine 14, the circuit board 40 for which the mounting work is completed is conveyed into the inspection machine 20 as illustrated in FIG. 10, and is held by the first conveyance device 76 of the inspection machine 20. At this time, the work start information is transmitted from the individual control device 118 of the inspection machine 20 to the individual control device 122 of the NG board discharge machine 24. Then, based on the information, the mark "O" in the column of the second working machine in the first lane on the positional information list proceeds to a column of the third working machine in the first lane. This indicates that the circuit board 40 is moved from the first conveyance device 26 of the mounting machine 14 to the first conveyance device 76 of the inspection machine 20.

Then, the inspection machine 20 carries out the inspection work for the circuit board 40. Based on the inspection result, the inspection result is added to the positional information of the circuit board 40. Specifically, when the result of the inspection work is not satisfactory in the inspection machine 20, that is, when the circuit board inspected by the inspection machine 20 is not normal (hereinafter, sometimes referred to as an "NG board"), NG board information is transmitted from the individual control device 118 of the inspection machine 20. Then, based on the information, the mark "O" in the column of the third working machine in the first lane on the positional information list is changed to a mark "NG". This indicates that the circuit board located in the first conveyance device 76 of the inspection machine 20 is the NG board.

In addition, if the mounting work is completed in the mounting machine 12, the circuit board 40 for which the mounting work is completed is conveyed into the mounting machine 14 as illustrated in FIG. 10, and is held by the second conveyance device 28 of the mounting machine 14. At this time, the work start information is transmitted from the individual control device 112 of the mounting machine 14. Then, based on the information, the mark "O" in the column of the first working machine in the second lane on the positional information list proceeds to a column of the second working machine in the second lane. This indicates that the circuit board 40 is moved from the second conveyance device 28 of the mounting machine 12 to the second conveyance device 28 of the mounting machine 14.

On the other hand, after the circuit board 40 for which the mounting work is completed is conveyed out, a new circuit board 40 is conveyed into the mounting machine 12 by the first conveyance device 26 as illustrated in FIG. 10. At this time, the work start information is transmitted from the individual control device 110 of the mounting machine 12. Then, based on the information, a mark "O" is added to the column of the first working machine in the first lane on the positional information list. This indicates that a new circuit board 40 is conveyed to the first conveyance device 26 of the mounting machine 12.

In addition, when the circuit board is conveyed to the further downstream side, the above-described positional information is set and the NG board information is added to the positional information. In this manner, the NG board discharge machine 24 can easily acquire information of each position of the multiple circuit boards 40 conveyed inside the mounting system 10 and information on whether or not each circuit board 40 is the NG board. Then, based on the positional information of the circuit board and the information related to the NG board, it is determined whether or not the circuit board 40 conveyed into the NG board discharge machine 24 is the NG board.

When the circuit board 40 conveyed into the NG board discharge machine 24 is the NG board, the above-described operation of the discharge mechanism 92 causes the NG board to be discharged to the checking position. Then, the information related to the NG board is displayed on the display device 102. Incidentally, the information related to the NG board is acquired from the oldest positional information of the working lane where the NG board is located. Specifically, as illustrated in FIGS. 8 to 10, the positional information of the circuit board 40 is stored for each working lane. The positional information of the circuit board conveyed in each lane is stored to follow a conveyed sequence. Therefore, the circuit board corresponding to the positional information of the foremost circuit board of each lane, that is, corresponding to the oldest positional information stored therein, is located in the NG board discharge machine 24 arranged on the most downstream side of each lane. Therefore, the information related to the NG board is acquired from the oldest positional information of the working lane where the NG board is located, and is displayed on the display device 102.

Then, a worker observes the NG board discharged to the checking position, based on the displayed information related to the NG board, and determines whether or not the NG board has to be removed from the mounting system 10. The reason is that there may be a case of erroneous determination by the inspection machines 20 and 22.

When the NG board is removed from the mounting system 10 by the determination of the worker, the information related to the NG board is deleted from the positional information list. On the other hand, when the NG board is not removed from the mounting system 10 by the determination of the worker, an operation of the discharge mechanism 92 causes the NG board to return to the conveyance line, and is discharged from the NG board discharge machine 24. That is, the NG board is conveyed out from a terminal of the mounting system 10.

In addition, when the circuit board 40 conveyed into the NG board discharge machine 24 is not the NG board, the circuit board 40 is conveyed to the downstream side by the conveyance devices 88 and 90 of the NG board discharge machine 24, and is conveyed out from the terminal of the mounting system 10. When the circuit board 40 is conveyed out from the terminal of the mounting system 10, the information related to the circuit board 40 is deleted from the positional information list.

In addition, in a case excluding the case where the circuit board 40 is discharged from the terminal of the mounting system 10 and the case where the NG board is removed from the checking position, the circuit board 40 may be drawn out from the inside of the mounting system 10. Specifically, some errors may occur during the conveyance of the circuit board 40 or during the work, thereby causing a worker to draw the circuit board 40 out from the conveyance line in some cases. Even in this case, the information related to the circuit board 40 is deleted from the positional information list.

In this way, the mounting system 10 can acquire the positional information of each of the multiple circuit boards 40 by using the positional information list. Then, the inspection result obtained by the inspection machines 20 and 22 is added to the positional information. Therefore, the mounting system 10 can easily recognize a position of the NG board, thereby enabling the NG board discharge machine 24 to easily carry out discharge work of the NG board.

On the other hand, according to the mounting system in the related art, the positional information of the circuit board cannot be acquired. Consequently, the circuit board having an ID number marked thereon is used, and reading work of the ID number is carried out for each circuit board. Then, the ID number and the inspection result obtained by the inspection machines 20 and 22 are associated with each other and stored, thereby managing a position of the NG board. As described above, since only the circuit board having the ID number marked thereon can be used according to the system in the related art, the system is very inconvenient. In addition, the reading work of the ID number causes a problem of decreased throughput.

In view of this problem, as described above, the mounting system 10 can easily recognize a position of the NG board without using the ID number. In this manner, since the circuit board having no ID number marked thereon can be used, the system is very convenient. In addition, the reading work of the ID number can be omitted. Therefore, it is possible to prevent the throughput from decreasing.

However, a system is present which can reliably carry out discharge work of the NG board even when the position of the NG board cannot be recognized. Specifically, in a case of the system where the NG board discharge machine is arranged adjacent of the downstream side of the inspection machine, the system can reliably carry out discharge work of the NG board even when the position of the NG board cannot be recognized. The reason is that the circuit board determined by the inspection machine is conveyed into the NG board discharge machine without passing through the other working machine, and that it is possible to reliably determine whether or not the circuit board conveyed into the NG board discharge machine is the NG board. However, when the multiple inspection machines are arranged in the system, it is necessary to arrange multiple NG board discharge machines. Consequently, there is a possibility of a large-sized system. In addition, it is necessary for a worker to check the NG boards discharged from the multiple NG board discharge machines, thereby increasing the burden of the worker.

On the other hand, as described above, the mounting system 10 can easily recognize a position of the NG board. Therefore, even when the multiple inspection machines are arranged in the system, one NG board discharge machine may be arranged therein. This can save arrangement space in the system. In addition, a worker may sufficiently check the NG board discharged from one NG board discharge machine, thereby decreasing the burden of the worker.

<Control Program>

Figure 11:
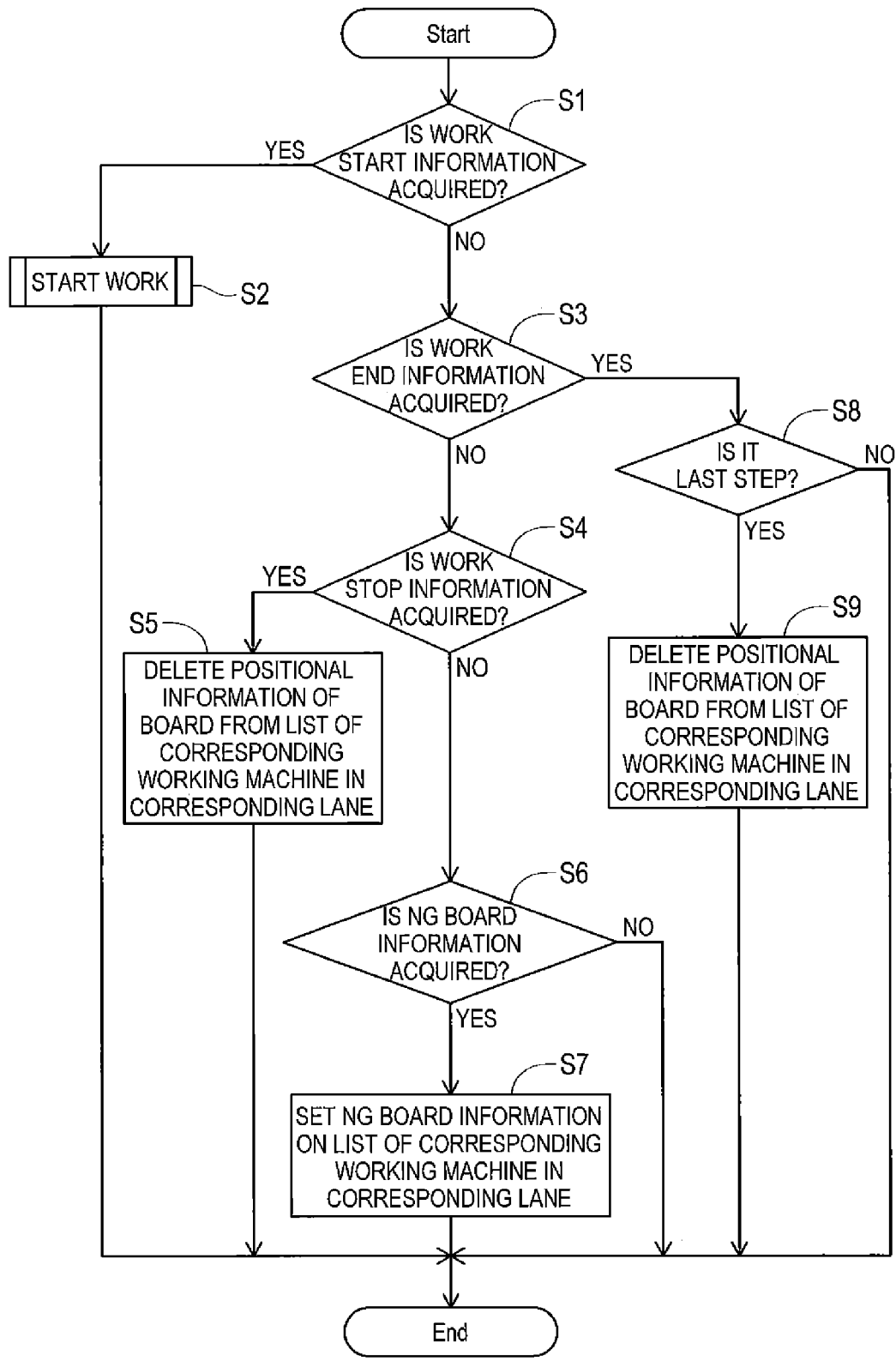
FIG. 11 is a flowchart illustrating a control program.
Figure 12:
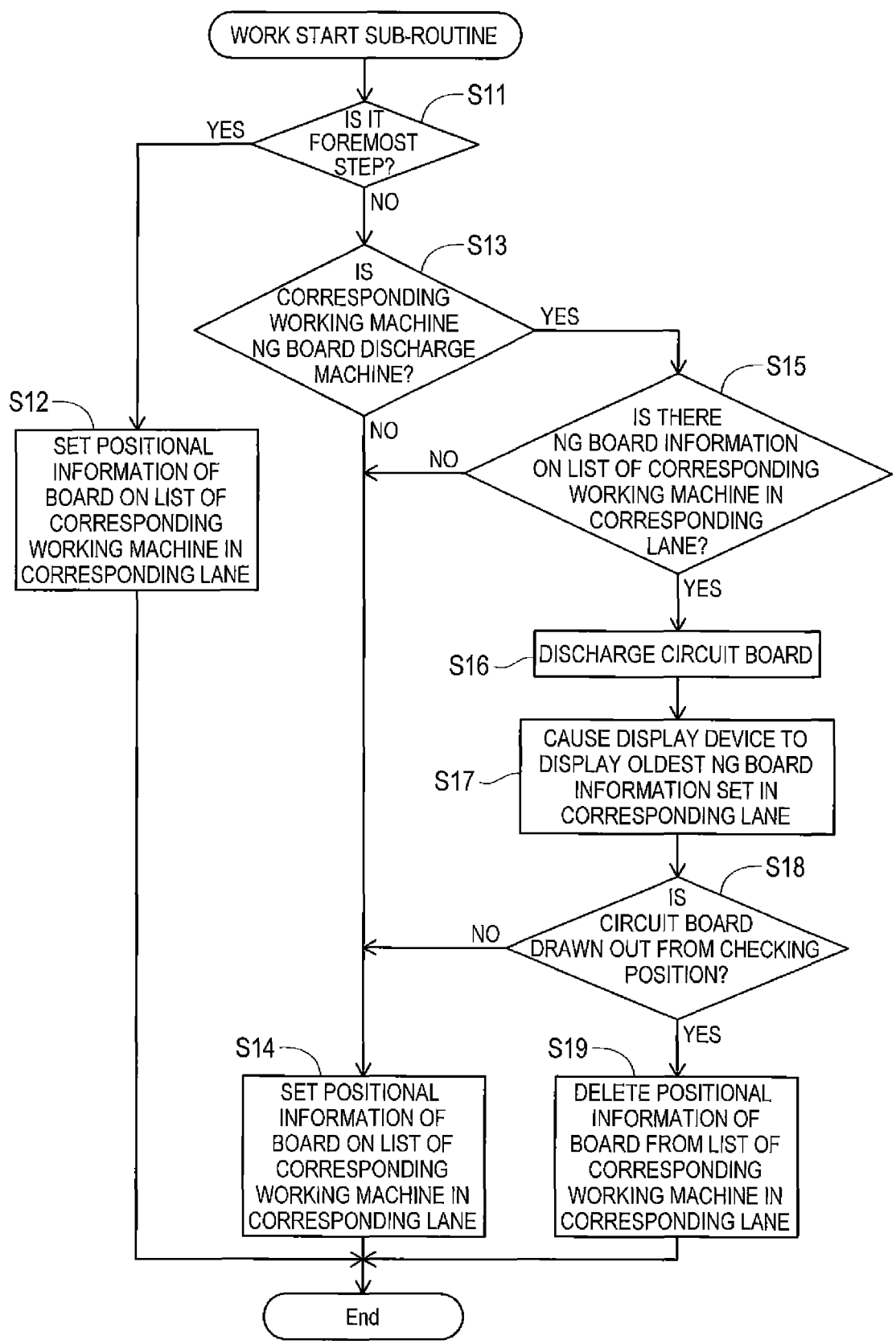
FIG. 12 is a flowchart illustrating a work start sub-routine of the control program.

Acquisition of the positional information of the NG board described above is performed by executing a control program illustrated by flowcharts in FIGS. 11 and 12. The control program is stored in the controller 128 of the individual control device 122 of the NG board discharge machine 24, and is executed by the controller 128. According to the control program, in Step 1 (hereinafter, simply abbreviated as "S1". Other Steps are also similarly abbreviated), the controller 128 determines whether or not the work start information is acquired from the individual control device 110 and the like of other working machines. When the work start information is acquired, in S2, the controller 128 executes a work start sub-routine illustrated in FIG. 12.

According to the work start sub-routine, in S11, the controller 128 determines whether or not the working machine from which the work start information is transmitted is the foremost working machine, that is, whether or not the working machine from which the work start information is transmitted is the mounting machine 12. When the working machine from which the work start information is transmitted is the mounting machine 12, in S12, the controller 128 sets information indicating that the circuit board 40 is located in the corresponding working lane of the corresponding working machine, on the positional information list. Here, the corresponding working machine means the working machine from which the work start information is transmitted. That is, the corresponding working machine in S12 is the mounting machine 12. In addition, the corresponding working lane means the working lane where the work starts, that is, any lane between the first lane and the second lane.

In addition, when the working machine from which the work start information is transmitted is not the mounting machine 12, in S13, the controller 128 determines whether or not the working machine from which the work start information is transmitted is the NG board discharge machine 24. When the working machine from which the work start information is transmitted is not the NG board discharge machine 24, in S14, the controller 128 sets information indicating that the circuit board 40 is located in the corresponding working lane of the corresponding working machine, on the positional information list.

In addition, when the working machine from which the work start information is transmitted is the NG board discharge machine 24, in S15, the controller 128 determines whether or not information related to the NG board is added to the positional information of the corresponding lane of the corresponding working machine. That is, referring to the positional information list, the controller 128 determines whether or not the NG board is located in the corresponding lane of the NG board discharge machine 24. When the NG board is not located in the corresponding lane of the NG board discharge machine 24, the flow proceeds to S14.

On the other hand, when the NG board is located in the corresponding lane of the NG board discharge machine 24, in S16, the controller 128 controls an operation of the discharge mechanism 92, and moves the NG board located in the corresponding lane to the checking position. Thereafter, in S17, the controller 128 causes the display device 102 to display the oldest information within the information related to the NG board which is set in the corresponding lane. Then, the flow proceeds to S18.

In S18, the controller 128 determines whether or not the NG board is drawn out from the checking position. Specifically, a sensor (not illustrated) is disposed at the checking position, and based on a detection result of the sensor, it is determined whether or not the NG board is drawn out from the checking position. When the NG board is not drawn out from the checking position, the flow proceeds to S14. On the other hand, when the NG board is drawn out from the checking position, in S19, the controller 128 deletes the positional information of the corresponding working lane of the corresponding working machine from the positional information list. Then, after the above-described processes in S12, S14, and S19, the execution of the work start sub-routine is completed.

In addition, when it is determined that the work start information is not acquired in S1, in S3, the controller 128 determines whether or not the work end information is acquired from the individual control device 110 or the like of other working machines. When the work end information is not acquired, in S4, the controller 128 determines whether or not work stop information is acquired from the individual control device 110 or the like of other working machines. When the work stop information is acquired, in S5, the controller 128 deletes the positional information of the corresponding working lane of the corresponding working machine from the positional information list. The work stop information is information indicating that some kinds of trouble occur during the conveyance or the work of the circuit board 40, and the circuit board 40 is drawn out from the conveyance line.

On the other hand, when the work stop information is not acquired, in S6, the controller 128 determines whether or not the NG board information is acquired from the individual control device 110 or the like of other working machines. When the NG board information is acquired, in S7, the controller 128 sets the NG board information in the positional information of the corresponding working lane of the corresponding working machine.

In addition, when it is determined that work end information is acquired in S3, in S8, the controller 128 determines whether or not the working machine from which the work end information is transmitted is the last working machine. That is, it is determined whether or not the working machine from which the work end information is transmitted is the NG board discharge machine 24. When the working machine from which the work end information is transmitted is the NG board discharge machine 24, in S9, the controller 128 deletes the positional information of the corresponding working lane of the corresponding working machine from the positional information list. Then, after the above-described processes in S2, S5, S7, and S9, alternatively when the NG board information is not acquired in S6, or when the working machine is not the last working machine in S8, the execution of the control program is completed.

<Modification Example>

In the mounting system 10 according to the above-described embodiment, the positional information of the NG board is acquired by using the positional information list. However, the positional information of the NG board can be acquired by using a temporary number set for each circuit board. Specifically, if the circuit board 40 is held by the first conveyance device 26 or the second conveyance device 28 of the mounting machine 12, the work start information is transmitted from the individual control device 110 of the mounting machine to the individual control device 122 of the NG board discharge machine 24. In the individual control device 122, a temporary number, for example, [01] is set in the circuit board located in the first conveyance device 26 or the second conveyance device 28 of the mounting machine 12. The positional information of the circuit board 40 is set in the temporary number [01]. That is, information indicating that the circuit board of the temporary number [01] is located in the first conveyance device 26 or the second conveyance device 28 of the mounting machine 12 is set.

If the mounting work is completed for the circuit board 40 having the set temporary number [01] in the mounting machine 12, the circuit board 40 is conveyed from the mounting machine 12 to the mounting machine 14. Then, if the circuit board 40 is held by the first conveyance device 26 or the second conveyance device 28 of the mounting machine 14, the work start information is transmitted from the individual control device 112 of the mounting machine 14 to the individual control device 122 of the NG board discharge machine 24. In the individual control device 122, information related to the corresponding lane and the corresponding working machine set in the temporary number [01] is updated. That is, the positional information of the temporary number [01] is updated to the first conveyance device 26 or the second conveyance device 28 of the mounting machine 14. In this way, the positional information to be set in the temporary number is updated each time the circuit board 40 is conveyed between the working machines. Accordingly, it is possible to easily acquire a position of the circuit board 40 having the set temporary number.

In addition, when the inspection machines 20 and 22 carry out the inspection work and the circuit board 40 located in the inspection machines 20 and 22 is the NG board, NG board information is added to the temporary number. In this manner, it is possible to easily acquire a position of the NG board. As described above, the temporary number is set for each circuit board, the positional information is set and updated in the temporary number, and further the NG board information is added to the temporary number. Accordingly, it is possible to obtain an effect the same as that of the above-described positional information list.

Figure 13:
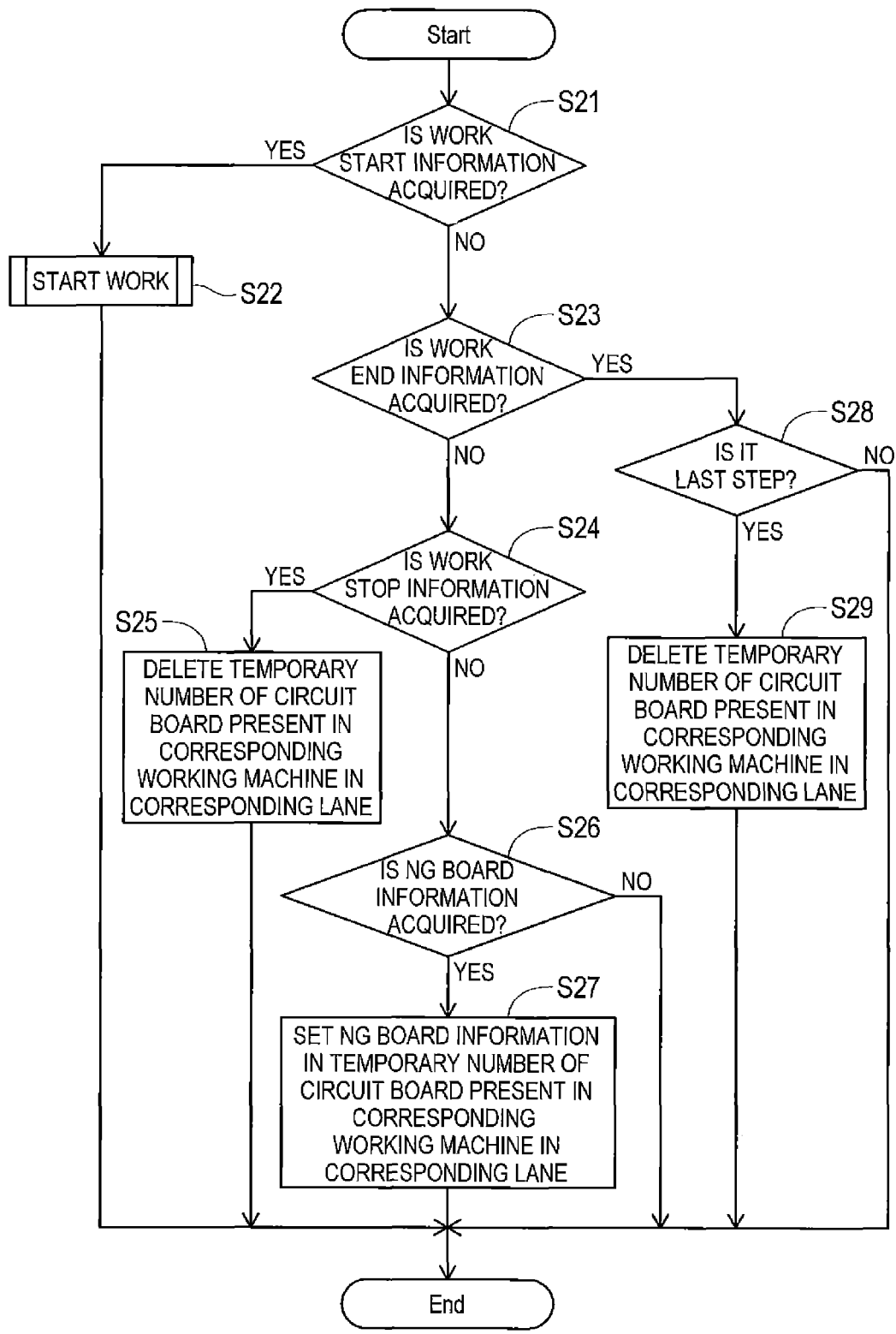
FIG. 13 is a flowchart illustrating a control program according to a modification example.
Figure 14:
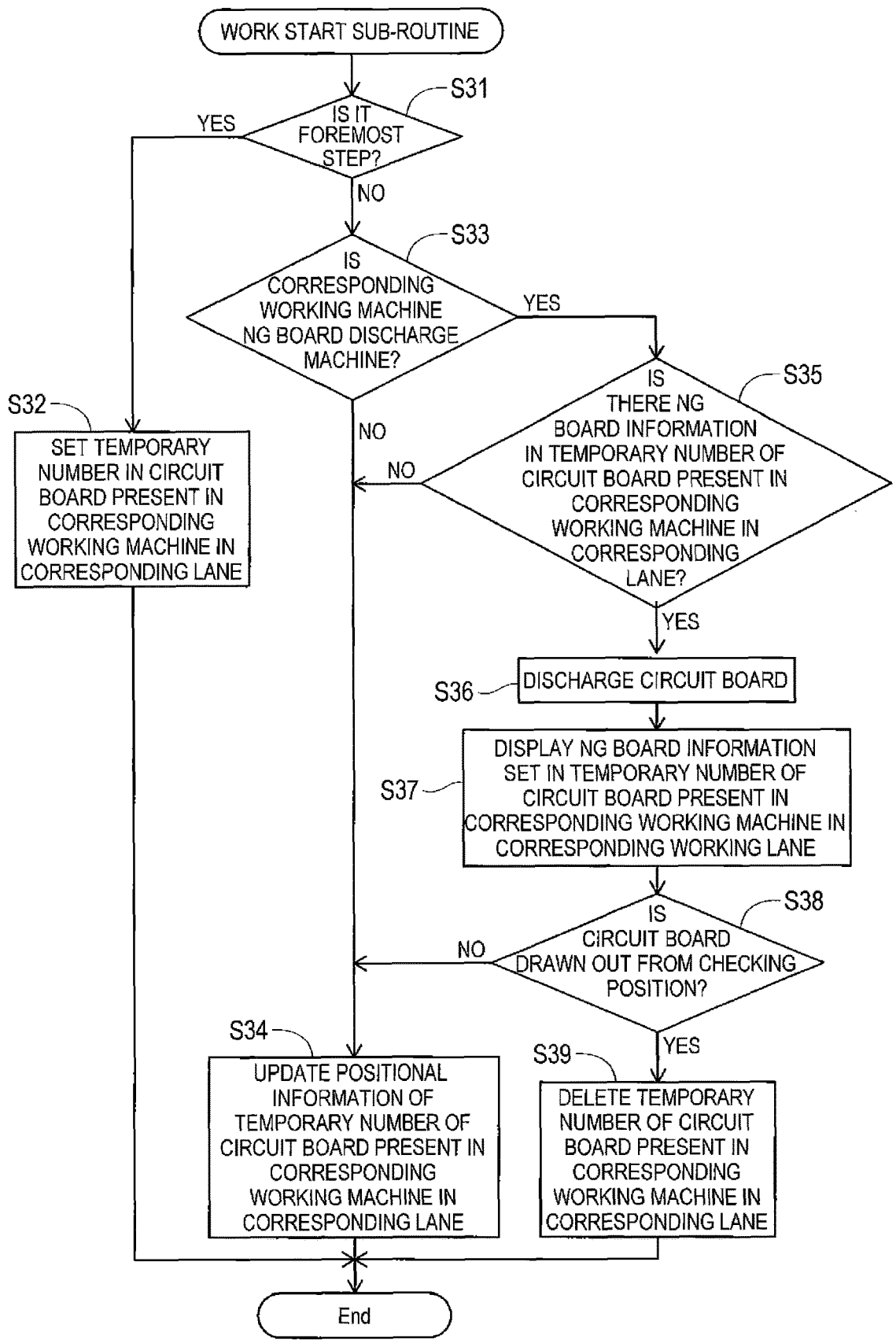
FIG. 14 is a flowchart illustrating a work start sub-routine of the control program according to the modification example.

The positional information of the NG board is acquired using the above-described temporary number by executing a control program illustrated by flowcharts in FIGS. 13 and 14. According to the control program, in S21, the controller 128 determines whether or not the work start information is acquired from the individual control device 110 or the like of other working machines. When the work start information is acquired, in S22, the controller 128 executes a work start sub-routine illustrated in FIG. 14.

According to the work start sub-routine, in S31, the controller 128 determines whether or not the working machine from which the work start information is transmitted is the mounting machine 12. When the working machine from which the work start information is transmitted is the mounting machine 12, in S32, the controller 128 sets a temporary number in the circuit board 40 present in the corresponding working lane of the corresponding working machine. Information indicating that the circuit board 40 is located in the corresponding working lane of the corresponding working machine is set in the temporary number.

In addition, when the working machine from which the work start information is transmitted is not the mounting machine 12, in S33, the controller 128 determines whether or not the working machine from which the work start information is transmitted is the NG board discharge machine 24. When the working machine from which the work start information is transmitted is not the NG board discharge machine 24, in S34, the controller 128 updates the positional information of the temporary number to the corresponding working lane of the corresponding working machine.

In addition, when the working machine from which the work start information is transmitted is the NG board discharge machine 24, in S35, the controller 128 determines whether or not information related to the NG board is added to the temporary number of the circuit board 40 located in the corresponding working lane of the corresponding working machine. That is, referring to the temporary number, the controller 128 determines whether or not the NG board is located in the corresponding lane of the NG board discharge machine 24. When the NG board is not located in the corresponding lane of the NG board discharge machine 24, the flow proceeds to S34.

On the other hand, when the NG board is located in the corresponding lane of the NG board discharge machine 24, in S36, the controller 128 controls an operation of the discharge mechanism 92, and moves the NG board located in the corresponding lane to the checking position. Thereafter, in S37, the controller 128 refers to the temporary number of the circuit board 40 located in the corresponding lane of the NG board discharge machine 24, and causes the display device 102 to display the information related to the NG board. Then, the flow proceeds to S38.

In S38, the controller 128 determines whether or not the NG board is drawn out from the checking position. When the NG board is not drawn out from the checking position, the flow proceeds to S34. On the other hand, when the NG board is drawn out from the checking position, in S39, the controller 128 deletes the temporary number of the circuit board 40 located in the corresponding working lane of the corresponding working machine. Then, after the above-described processes in S32, S34, and S39, the execution of the work start sub-routine is completed.

In addition, when it is determined that the work start information is not acquired in S21, in S23, the controller 128 determines whether or not the work end information is acquired from the individual control device 110 or the like of other working machines. When the work end information is not acquired, in S24, the controller 128 determines whether or not the work stop information is acquired from the individual control device 110 or the like of other working machines. When the work stop information is acquired from the individual control device 110 or the like of other working machines, in S25, the controller 128 deletes the temporary number of the circuit board 40 located in the corresponding working lane of the corresponding working machine.

On the other hand, when the work stop information is not acquired, in S26, the controller 128 determines whether or not the NG board information is acquired from the individual control device 110 or the like of other working machines. When the NG board information is acquired, in S27, the controller 128 sets the NG board information in the temporary number of the circuit board 40 located in the corresponding working lane of the corresponding working machine.

In addition, when it is determined that the work end information is acquired in S23, in S28, the controller 128 determines whether or not the working machine from which the work end information is transmitted is the NG board discharge machine 24. When the working machine from which the work end information is transmitted is the NG board discharge machine 24, in S29, the controller 128 deletes the temporary number of the circuit board 40 located in the corresponding working lane of the corresponding working machine. Then, after the above-described processes in S22, S25, S27, and S29, alternatively when the NG board information is not acquired in S26, or when the working machine is not the last working machine in S28, the execution of the control program is completed.

<Functional Configuration of Control Device>

In view of the execution processes, the controller 128 of the individual control device 122 for executing the above-described control programs can be considered to have a functional configuration as illustrated in FIG. 7. As is understood from the drawing, the controller 128 has a positional information acquisition unit 140, an NG board information addition unit 142, an NG board determination unit 144, a discharge mechanism operation control unit 146, and an NG board information display unit 148. The positional information acquisition unit 140 is a functional unit for executing the processes in S12, S14, S32, and S34, that is, a functional unit for acquiring the positional information of the circuit board 40. The NG board information addition unit 142 is a functional unit for executing the processes in S7 and S27, that is, a functional unit for adding the NG board information to the positional information. The NG board determination unit 144 is a functional unit for executing the processes in S15 and S35, that is, a functional unit for determining whether or not the circuit board 40 conveyed to the NG board discharge machine 24 is the NG board. The discharge mechanism operation control unit 146 is a functional unit for executing the processes in S16 and S36, that is, a functional unit for controlling an operation of the discharge mechanism 92 and discharging the NG board to the checking position. The NG board information display unit 148 is a functional unit for executing the processes in S17 and S37, that is, a functional unit for causing the display device 102 to display the NG board information.

Incidentally, in the above-described embodiment and the modification example, the electronic component mounting system 10 is an example of the board working system. The electronic component mounting machines 12, 14, 16, and 18, the inspection machines 20 and 22, and the NG board discharge machine 24 are examples of the working machines. The inspection machines 20 and 22 are examples of the inspection-purpose working machines. The NG board discharge machine 24 is an example of the checking-purpose working machine. The discharge mechanism 92 is an example of the board moving mechanism. The display device 102 is an example of the display device. The individual control device 122 is an example of the control device. The positional information acquisition unit 140 is an example of the positional information acquisition unit. The NG board information addition unit 142 is an example of the memory section. The NG board determination unit 144 is an example of the determination unit. The discharge mechanism operation control unit 146 is an example of the moving mechanism operation control unit. The NG board information display unit 148 is an example of the display unit.

Without being limited to the above-described embodiment and the modification example, the present disclosure can be modified and improved in various ways, based on knowledge of those skilled in the art. Specifically, for example, in the above-described embodiment, the multiple inspection machines 20 and 22 are arranged in the mounting system 10. However, the technique of the present disclosure can be applied to a system having one inspection machine arranged therein. In this case, it is preferable to arrange another working machine between one inspection machine and the NG board discharge machine. The reason is that when another working machine is not arranged between one inspection machine and the NG board discharge machine, an advantageous effect of acquiring a position of the NG board is hardly utilized.

In addition, in the above-described embodiment, the NG board employs a circuit board on which an electronic component is not appropriately mounted. However, it is possible to employ a circuit board whose various work results are not satisfactory. Specifically, for example, the NG board can employ a circuit board in which printing work and coating work of solder or glue are not appropriately carried out.

In addition, in the above-described embodiment, various commands and information items are transmitted and received between the individual control device 110 and the like. However, an overall control device may be disposed therein, and the various commands and information items may be transmitted and received from the overall control device to the multiple individual control devices 110 or the like. In this case, various functional units may be disposed in the overall control device.

EXPLANATION OF REFERENCE

10: ELECTROMAGNETIC COMPONENT MOUNTING SYSTEM (BOARD WORKING SYSTEM) 12: ELECTRONIC COMPONENT MOUNTING MACHINE (WORKING MACHINE) 14: ELECTRONIC COMPONENT MOUNTING MACHINE (WORKING MACHINE) 16: ELECTRONIC COMPONENT MOUNTING MACHINE (WORKING MACHINE) 18: ELECTRONIC COMPONENT MOUNTING MACHINE (WORKING MACHINE) 20: INSPECTION MACHINE (WORKING MACHINE) (INSPECTION-PURPOSE WORKING MACHINE) 22: INSPECTION MACHINE (WORKING MACHINE) (INSPECTION-PURPOSE WORKING MACHINE) 24: NG BOARD DISCHARGE MACHINE (WORKING MACHINE) (CHECKING-PURPOSE WORKING MACHINE) 92: DISCHARGE MECHANISM (BOARD MOVING MECHANISM) 102: DISPLAY DEVICE 122: INDIVIDUAL CONTROL DEVICE (CONTROL DEVICE) 140: POSITIONAL INFORMATION ACQUISITION UNIT 142: NG BOARD INFORMATION ADDITION UNIT (MEMORY SECTION) 144: NG BOARD DETERMINATION UNIT (DETERMINATION UNIT) 146: DISCHARGE MECHANISM OPERATION CONTROL UNIT (MOVING MECHANISM OPERATION CONTROL UNIT) 148: NG BOARD INFORMATION DISPLAY UNIT (DISPLAY UNIT)

The invention claimed is:

1. A board working system, comprising:
multiple working machines including multiple paths in parallel to each other through each of the working machines on which circuit boards are conveyed in a conveyance direction from an upstream side to a downstream side of the multiple working machines, and each of the multiple working machines sequentially carries out work for the circuit boards, the multiple working machines include
multiple inspection-purpose working machines which inspect the work for the circuit boards, the multiple inspection-purpose working machines each including
an inspection head,
an inspection camera mounted on a lower end surface of the inspection head, and
multiple first conveyance devices corresponding to the multiple paths, each including a first conveyor belt; and
a checking-purpose working machine including
multiple second conveyance devices each including a second conveyor belt, a quantity of the first conveyance devices equaling a quantity of the second conveyance devices, and
a board moving mechanism including multiple panels on top of which the multiple second conveyance devices are respectively arranged, the multiple panels configured to move in a direction orthogonal to the conveyance direction to discharge the circuit boards from the multiple paths to a checking position visible to a worker, the checking-purpose working machine arranged immediately downstream of one of the multiple inspection-purpose working machines in the conveyance direction, the board moving mechanism configured to move any one of the second conveyance devices to connect to any one of the first conveyance devices of the one of the multiple inspection-purpose working machines via the multiple panels.

2. The board working system according to claim 1, wherein the checking-purpose working machine discharges the circuit boards from the multiple paths in accordance with an inspection result of at least one of the multiple inspection-purpose working machines.

3. The board working system according to claim 1, further comprising:
a positional information acquisition unit that acquires positional information of each of the circuit boards,
wherein with respect to the circuit boards conveyed through each of the multiple paths, the positional information acquisition unit stores a sequence and a conveying path of the circuit boards conveyed through each of the multiple paths, and acquires the positional information, based on the sequence and the conveying path of the circuit boards.

4. The board working system according to claim 1, further comprising:
a positional information acquisition unit that acquires positional information of each of the circuit boards,
wherein with respect to the circuit boards conveyed through each of the multiple paths, the positional information acquisition unit sets a symbol for distinguishing the circuit boards from each other, and acquires the positional information, based on the symbol, a conveying path through which a circuit board having set the symbol is conveyed, and a working machine of the multiple working machines which conveys the circuit board having the set symbol.

* * * * *